United States Patent [19]

Jacoby

[11] Patent Number: 5,771,966
[45] Date of Patent: Jun. 30, 1998

[54] FOLDED CONDUCTING MEMBER HEATSINKS AND METHOD OF MAKING SAME

[76] Inventor: John Jacoby, P.O. Box 598, New Hampton, N.H. 03256

[21] Appl. No.: 573,447

[22] Filed: Dec. 15, 1995

[51] Int. Cl.$^6$ .................................................. H05K 7/20
[52] U.S. Cl. .......................................... 165/185; 361/704
[58] Field of Search .................................. 165/80.3, 185, 165/183; 361/704; 174/16.3

[56] References Cited

U.S. PATENT DOCUMENTS

| 1,830,375 | 11/1931 | Shoop | 165/183 X |
|---|---|---|---|
| 4,095,253 | 6/1978 | Yoshimura et al. | 357/81 |
| 4,544,942 | 10/1985 | McCarthy | 357/81 |
| 5,406,698 | 4/1995 | Lipinski | 29/727 |

FOREIGN PATENT DOCUMENTS

| 1100057 | 2/1961 | German Dem. Rep. | 165/185 |
|---|---|---|---|
| 55-85049 | 6/1980 | Japan | 165/185 |
| 60-257157 | 12/1985 | Japan | 165/185 |

OTHER PUBLICATIONS

J.B. Randolph, "Transistor Heat Sink" IBM Tech. Disclosure Bulletin vol. 14 No. 5 pp. 1489–1490, Oct. 1971.

*Primary Examiner*—Allen J. Flanigan
*Attorney, Agent, or Firm*—Daniel J. Bourque; Kevin J. Carroll

[57] ABSTRACT

A folded heat conducting member heatsink includes a base portion and a folded heat conducting member secured into engagement with the base portion with one or more folded heat conducting member securing element, such as annealed metal inserts. The folded heat conducting member includes at least first and second heat conducting portions, such as fins, extending from a fold portion engaged with one or more grooves in the base portion. The securing element or insert is swaged or deformed to force the heat conducting portions into engagement with the groove of the base portion. The method of making the heat sink includes: inserting one or more securing elements, between the heat conducting portions; inserting the heat conducting portions into the groove of the base portion; and applying pressure to the securing elements, such as with an impacting die, to swage or deform the securing elements. The base portion and heat conducting portions of the folded heat conducting member are made of a heat conductive material. The securing elements are made of a similar heat conductive material in an annealed form so that the securing elements can be deformed to fit the shape of the groove and secure the fin portions of the folded heat conducting member into engagement with the groove of the base portion.

19 Claims, 3 Drawing Sheets

FOLDED CONDUCTING MEMBER HEATSINKS AND METHOD OF MAKING SAME

FIELD OF THE INVENTION

This invention relates to heatsinks and methods of making heatsinks and in particular, to a folded swaged fin heatsink and a method of making such a heatsink.

BACKGROUND OF THE INVENTION

Heatsinks are commonly used for dissipating heat generated or emitted by devices or components such as electronic circuits and other electronic components. Typically, the heatsinks include a base portion or plate which is mounted to the heat generating or emitting component and one or more fins extending from the base portion, for dissipating the generated heat. The heat is conducted from the heat emitting component to the base portion to one or more fins and then to the surrounding environment.

In the past, conventional bonding methods, such as soldering, brazing or epoxy bonding, were used to secure the fins to the base portion or plate. Such bonding methods are often time-consuming, tedious, relatively expensive and often result in a bond which does not conduct heat as well as desired.

Other methods for making fin heatsinks, such as that disclosed in U.S. Pat. No. 5,406,698 to Lipinski, include placing individual fins in grooves in a base plate and swaging or deforming the base plate to engage each individual fin. This method disclosed in Lipinski requires the use of a machine for applying pressure and swaging the base plate and is not cost effective.

Accordingly, what is needed is a heatsink in which one or more folded conducting members, such as fins, are securely engaged with a base portion in a manner that maximizes the mechanical bond between the conducting member or fins and the base portion as well as the thermal conductivity between the base portion and the conducting member. What is also needed is a relatively simple method of making such a heatsink that sufficiently bonds the conducting member or fins to the base portion in a cost effective manner.

SUMMARY OF THE INVENTION

The present invention features a heatsink, for dissipating heat from a heat generating or emitting component, comprising at least one folded heat conducting member secured to a base portion by at least one folded heat conducting member securing element. The folded heat conducting member includes at least first and second heat conducting portions extending from a fold portion and includes a base portion engaging region. The base portion includes a first side having a heat receiving region adapted to be positioned proximate the heat emitting component, and a second side having at least one folded heat conducting member engaging region, for engaging the base portion engaging region of the folded heat conducting member. The folded heat conducting member securing element is disposed between the first and second heat conducting portions and proximate the fold portion of the folded heat conducting member so that the folded heat conducting member securing element secures the base portion engaging region of the folded heat conducting member into engagement with the folded heat conducting member engaging region of the base portion.

In the preferred embodiment, the folded heat conducting member engaging region of the base portion includes at least one groove, for receiving the base portion engaging region of the folded heat conducting member. The folded heat conducting member securing element and base portion engaging region of the folded heat conducting member are deformed or swaged to secure the base portion engaging region in the groove. One example of the groove includes a groove having at least first and second undercut walls extending from a groove opening so that the width of the groove increases with the depth of the groove. In another example, the groove has a substantially cylindrical shape and a predetermined depth of the groove is greater than a predetermined radius of the substantially cylindrical shape. The folded heat conducting member securing element holds the base portion engaging region of the folded heat conducting member against the first and second undercut walls or the cylindrical walls of the groove and thereby provides a secure mechanical bond between the heat conducting member and the base portion.

In one embodiment, the heatsink includes a continuous folded heat conducting member having a plurality of heat conducting portions, a plurality of fold portions between each of the plurality of heat conducting portions and a plurality of base portion engaging regions. Each of the plurality of base portion engaging regions of the continuous folded heat conducting member is engaged with one of a plurality of grooves in the base portion.

In another embodiment, the finned heatsink includes a plurality of U-shaped folded heat conducting members each having first and second heat conducting portions extending from a fold portion. Each U-shaped folded heat conducting member includes a base portion engaging region engaged with a groove in the base portion.

One embodiment of the heat conducting portions of the folded heat conducting member includes one or more fin portions extending from the fold portion of the folded heat conducting member.

In the preferred embodiment, the folded heat conducting member securing element includes at least one annealed metal insert having a predetermined thickness corresponding to a distance between the first and second heat conducting portions and a predetermined thickness corresponding to a depth of the groove so that the annealed metal insert conforms to the shape of the groove when deformed or swaged to secure the base portion engaging region of the folded heat conducting member into engagement with the groove.

Preferably, the folded heat conducting member, base portion, and folded heat conducting member securing element are all made of a heat conductive material, such as aluminum, copper or similar materials. For example, the base portion is fabricated from a work-hardened heat conductive metal material or fabricated from an extruded heat conductive metal material. The folded heat conducting member and folded heat conducting member securing element are preferably fabricated from a heat conductive material in an annealed form.

The method of making a heatsink according to the present invention comprises the steps of: providing at least one folded heat conducting member having at least first and second heat conducting portions extending from at least one fold portion, a base portion having at least one folded heat conducting member engaging region, and at least one folded heat conducting member securing element; inserting the folded heat conducting member securing element between the first and second heat conducting portions and proximate the fold portion; inserting the fold portion with the folded heat conducting member securing element into the folded heat conducting member engaging region on the base portion; and swaging the folded heat conducting member securing element, causing the folded heat conducting member securing element to expand and secure the first and second heat conducting portions of the folded heat conducting member within the folded heat conducting member engaging region of the base portion.

According to the preferred method, the folded heat conducting member securing element includes at least one annealed metal insert, and swaging the folded heat conducting member securing element includes applying pressure to the annealed metal insert with a die member. The step of swaging the folded heat conducting member securing element preferably includes applying pressure to the folded heat conducting member securing element to cause the folded heat conducting member securing element to expand and secure the first and second heat conducting portions of the folded heat conducting member against first and second walls of a groove in the base portion. The method can also include forming the folded heat conducting member having at least first and second heat conducting portions extending from a fold portion, forming the base portion including at least one groove, and forming the folded heat conducting member securing element from an annealed material.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENT

Figure 1:
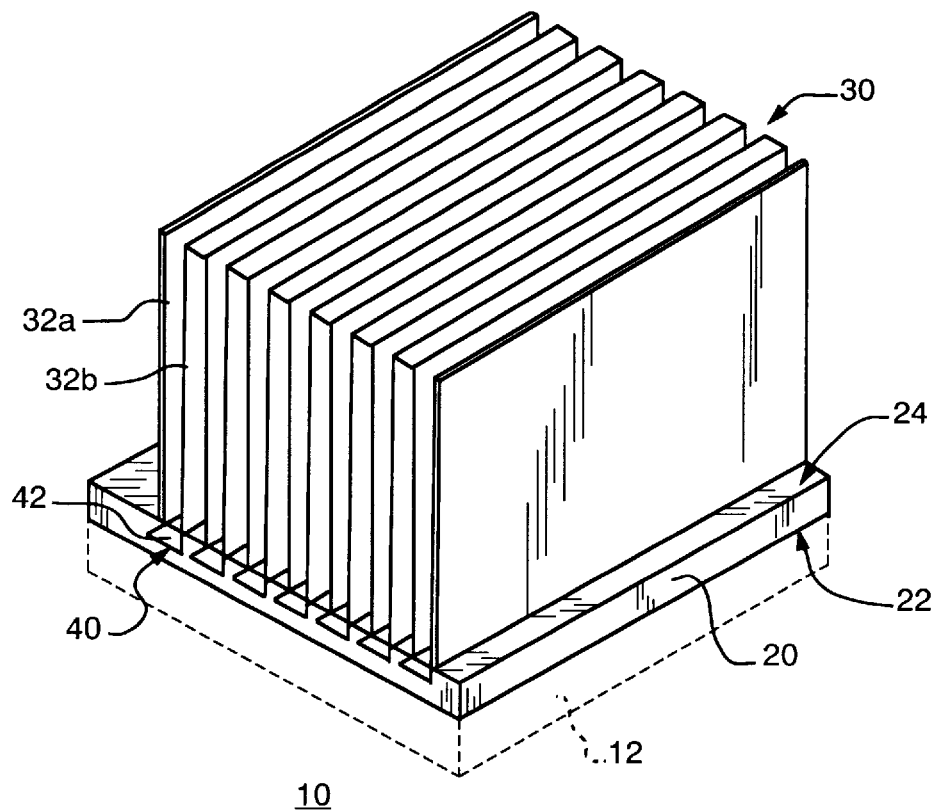
FIG. 1 is a perspective view of a heatsink according to the present invention.

A folded heat conducting member heatsink 10, FIG. 1, according to the present invention, is used to dissipate heat from a heat generating or emitting component 12, such as an electronic circuit or other similar electronic component. The heatsink 10 includes a base portion 20, such as a plate, positioned against the heat generating component 12 and at least one folded heat conducting member 30 extending from the base portion 20. The folded heat conducting member 30 and base portion 20 are preferably made of a heat conductive material, such as aluminum, copper, or other similar metals.

The heat conducting base portion 20 includes a first side 22 that contacts the component 12, for receiving heat from the component 12. The base portion 20 further includes a second side 24 from which the folded heat conducting member 30 extends. The second side 24 of the base portion 20 includes at least one folded heat conducting member engaging region 40, such as one or more grooves in the base portion 20 for engaging the folded heat conducting member 30, as described in greater detail below. The folded heat conducting member 30 includes at least first and second heat conducting portions 32a, 32b engaged with and extending from the heat conducting member engaging region 40. The base portion 20 conducts heat from the component 12 to the heat conducting portions 32a, 32b of the folded heat conducting member 30 and the heat conducting portions 32a, 32b dissipate the heat to the surrounding environment. Although the heat conducting portions 32a, 32b are shown as fin portions, the present invention contemplates various shapes of the heat conducting portions 32a, 32b including, but not limited to, pin-shaped portions, spiralshaped portions, and other shapes.

The heatsink 10 further includes one or more folded heat conducting member securing elements 42 disposed between at least first and second heat conducting portions 32a, 32b in the folded heat conducting member engaging region 40 of the base portion 20. The folded heat conducting member securing element 42 secures the at least first and second heat conducting portions 32a, 32b of the folded heat conducting member 30 into engagement with the base portion 20. Each folded heat conducting member securing element 42 is preferably made of an annealed metal material that is malleable or deformable. The folded heat conducting member securing element 42 is swaged causing the securing element 42 to expand within the folded heat conducting member engaging region 40, such as a groove, and forcing the first and second heat conducting portions 32a, 32b into engagement with the heat conducting member engaging region or groove 40. The one or more securing elements 42 thereby provide a secure mechanical bond and thermal conductivity between the folded heat conducting member 30 and base portion 20.

Figure 2:
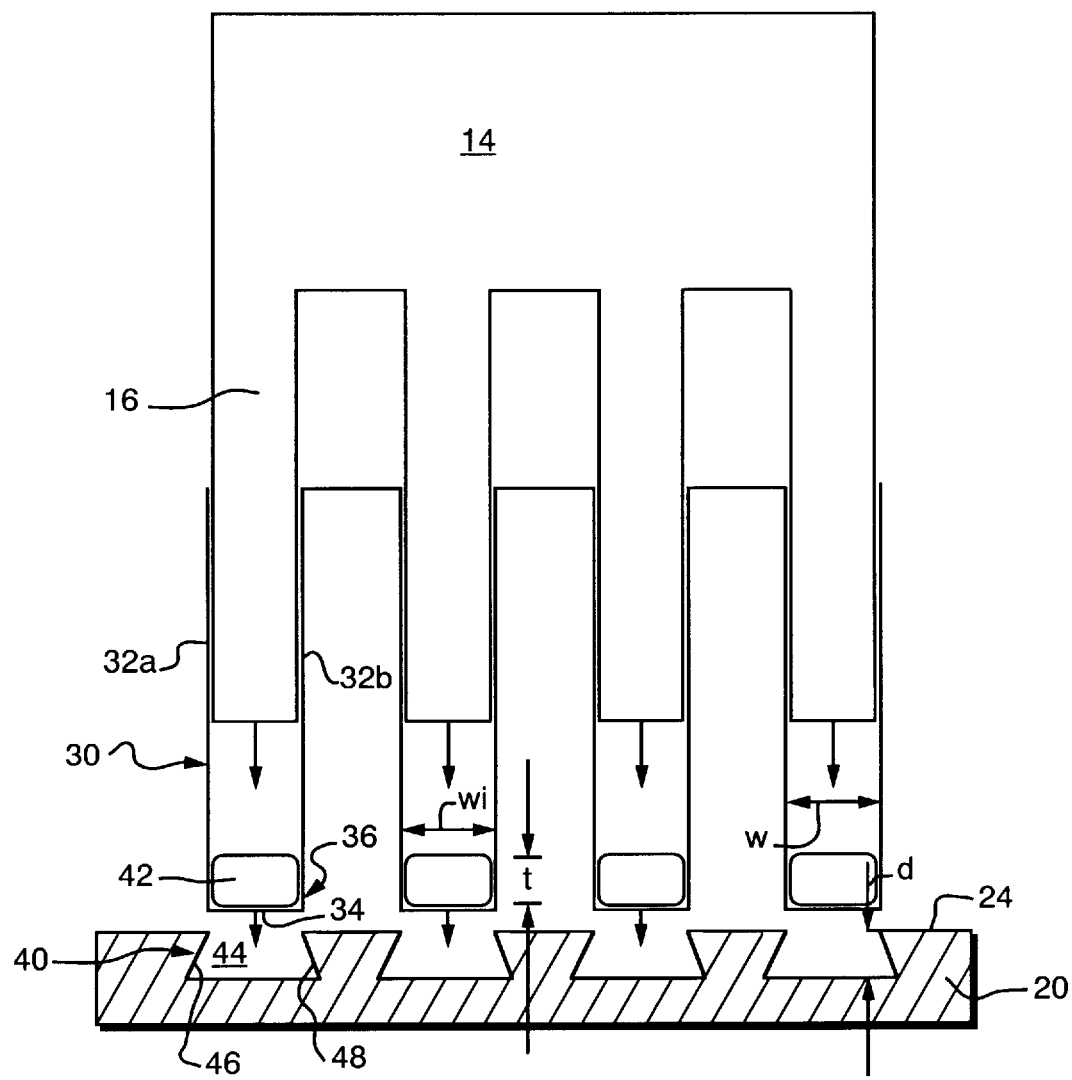
FIG. 2 is an elevational cross-sectional view of a heatsink according to the present invention being formed by applying pressure with an impacting die member.

In the preferred embodiment, the folded heat conducting member engaging region 40, FIG. 2, on the base portion 20 includes one or more grooves 44 extending along the base portion 20 proximate the first side 24. In one preferred embodiment, the one or more grooves 44 include first and second undercut walls 46, 48. The first and second undercut walls 46, 48 form a groove 44 in which the width w of the groove 44 increases with the depth d of the groove 44.

The preferred embodiment of the folded heat conducting member 30 includes a fold portion 34 extending between first and second heat conducting portions 32a, 32b and a base portion engaging region 36 generally locating where the heat conducting portions 32a, 32b meet the fold portion 34. The base portion engaging region 36 is adapted to be received in the groove 44 and engage the first and second walls 46, 48 of the groove 44. The folded heat conducting member securing element 42 is preferably formed as an annealed metal insert having a width $w_i$ that fits between the fin portions 32a, 32b and a thickness t corresponding to the depth of the groove 44.

The method of making the heatsink according to the present invention includes inserting the folded heat conducting member securing element or insert 42 between first and second heat conducting portions 32a, 32b and proximate fold portion 34. The base portion engaging region 36 of the first and second heat conducting portions 32a, 32b and fold portion 34 is then inserted into the groove 44. Each securing element or insert 42 is then swaged or deformed, such as by applying pressure to the securing element or insert 42, thereby causing the securing element 42 and the base portion engaging region 36 to expand and forcing the base portion engaging region 36 into engagement with the walls 46, 48 of the groove 44 (FIGS. 3 and 4).

The preferred method includes using an impacting die 14, having one or more die members 16 that extend between first and second heat conducting portions 32a, 32b and apply force and pressure against each securing element or insert 42. Multiple die members 16 allow the impacting die 14 to impact and swage or deform a plurality of securing elements or inserts 42 and simultaneously secure a plurality of base portion engaging regions 36 of the folded heat conducting member 30.

Figure 3:
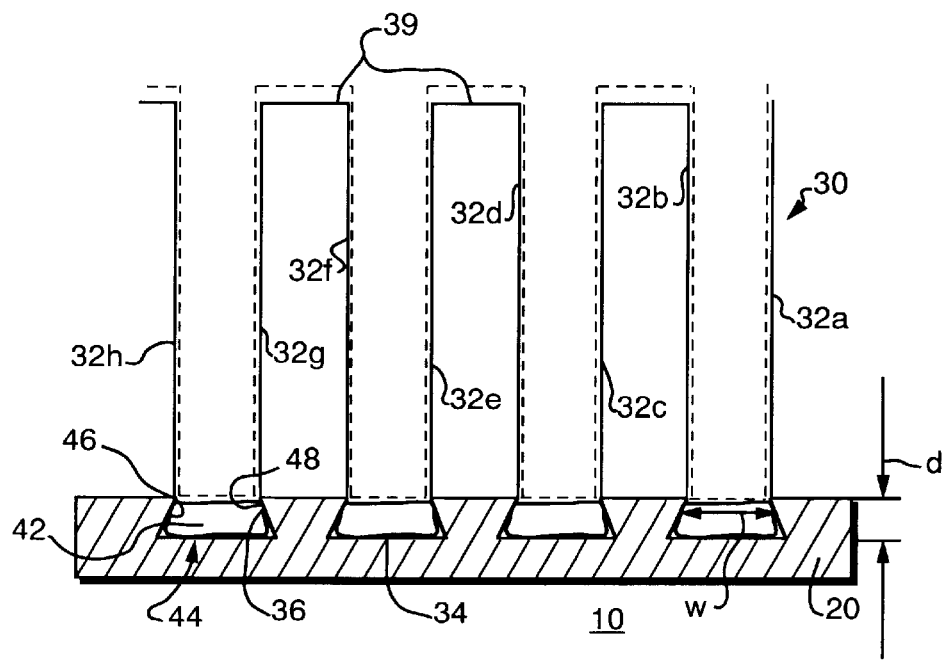
FIG. 3 is an elevational cross-sectional view of a heatsink according to one embodiment of the present invention.
Figure 4:
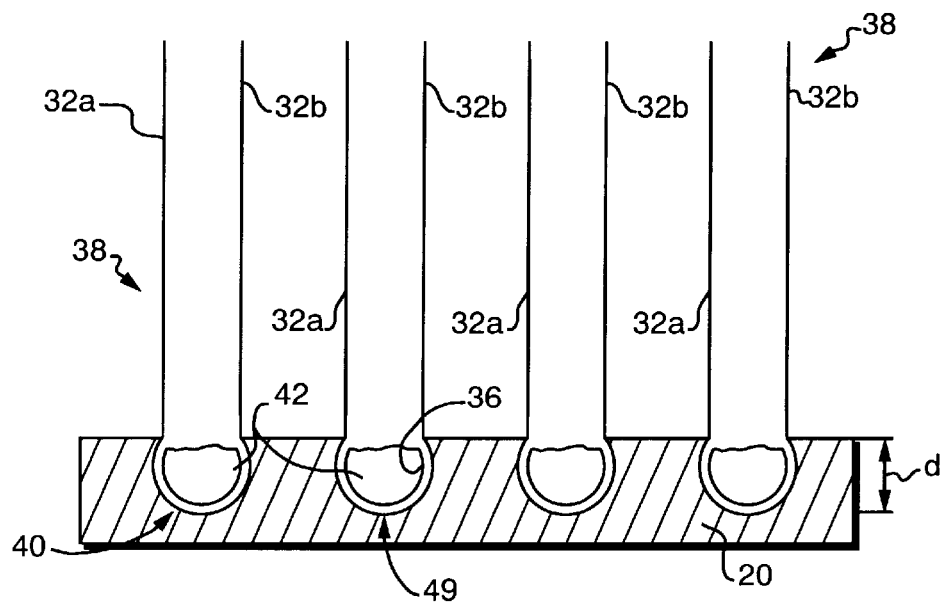
FIG. 4 is an elevational cross-sectional view of a heatsink according to an alternative embodiment of the present invention.

The securing elements or inserts 42, FIG. 3, are swaged or deformed so that the securing members or inserts 42 expand and take the shape of the grooves 44 and cause the base portion engaging region 36 of the folded heat conducting member 30 to expand and take the shape of the grooves 44. In one preferred embodiment, the undercut walls 46, 48 of the grooves 44 secure the base portion engaging region 36 of the folded heat conducting member 30 into engagement with the base portion 20.

In one embodiment, the heatsink 10 includes a continuous folded heat conducting member 30 having a plurality of heat conducting portions 32a–32h, such as fins, and fold portions 34, 39 between each of the plurality of heat conducting portions 32a–32h. The continuous folded heat conducting member 30 also includes a plurality of base portion engaging regions 36 that can be simultaneously secured into engagement with the base portion 20.

In an alternative embodiment, the heatsink 10, FIG. 4., includes a plurality of U-shaped heat conducting members 38. Each of the U-shaped folded heat conducting members 38 include first and second heat conducting portions 32a, 32b, such as fins. Each of the U-shaped heat conducting members 38 also include a base portion engaging region 36 and can be simultaneously secured into engagement with the base portion 20.

An alternative embodiment of the folded heat conducting member engaging regions 40 include one or more substantially cylindrical shaped grooves 49. Preferably, the depth d of the substantially cylindrical shaped grooves 49 is greater than the radius r of the substantially cylindrical shaped grooves 49 so that the securing elements or inserts 42 will take the shape of the substantially cylindrical shaped groove 49 and the walls of the cylindrical shaped groove 49 will secure the base portion engaging region 36 of the folded heat conducting member 30.

The base portion 20 is preferably made of a heat conductive material, such as aluminum, copper or other similar materials. In one example, the base portion 20 is fabricated from heat conductive materials in a work-hardened or as-extruded condition. The grooves 44, 49 in the base portion 20 can be formed by extruding, machining, or other similar methods. A base portion 20 made of aluminum preferably has a Brinell hardness of approximately 60 or more, and a base portion 20 made of copper preferably has a Brinell hardness of approximately 90 or more.

The folded heat conducting member 30 is also preferably made of a heat conductive material, such as aluminum, copper or other similar materials. In one example, the folded heat conducting member is fabricated from O-temper or annealed stock. Folded heat conducting members 30 made from an aluminum stock preferably have a Brinell hardness approximately in the range of 20 to 40 and folded heat conducting members 30 made from a copper stock preferably have a Brinell hardness approximately in the range of 40 to 50.

The securing elements or inserts 42 are preferably made from the same heat conductive materials as either the base portion 20 or folded heat conducting member 30, such as aluminum, copper or similar materials. The securing elements or inserts 42 are preferably fabricated in an annealed form with a temper preferably equal to or lower than that of the stock used for the folded heat conducting member 30. The securing elements or inserts 42, therefore, provide a secure mechanical bond between the base portion engaging regions 36 of the folded heat conducting member 30 and the walls of the grooves 44 as well as the desired thermal conductivity between the base portion 20 and the heat conducting member 30.

The present invention contemplates various types of heat conductive materials as well as mixing the heat conductive materials of the base portion and folded heat conducting member to achieve a desired thermal conductivity. Also, a sealant coating (not shown) may be used at the interface between the folded heat conducting member engaging regions 40 and the base portion engaging regions 36.

Accordingly, the folded heatsink according to the present invention provides a secure mechanical bond between the heat conducting portions of the folded heat conducting member and the base portion. The heatsink also provides the desired thermal conductivity between the base portion and the folded heat conducting member so that the heatsink can effectively dissipate heat from a heat generating or emitting component. The method of making the heatsink according to the present invention provides a cost effective and efficient method of providing the secure mechanical bond and desired thermal conductivity between the base portion and the folded heat conducting member.

Modifications and substitutions by one of ordinary skill in the art are considered to be within the scope of the present invention which is not to be limited except by the claims which follow.

What is claimed is:

1. A heatsink, for dissipating heat from a heat emitting component, said heatsink comprising:
   at least one folded heat conducting member including at least first and second heat conducting portions extending from a fold portion, said at least one folded heat conducting member further including a base portion engaging region;
   a base portion, for conducting heat from said heat emitting component to said at least one folded heat conducting member, said base portion including at least first and second sides, said first side having a heat receiving region adapted to be positioned proximate said heat emitting component, and said second side having at least one groove for receiving and engaging said base portion engaging region of said at least one folded heat conducting member; and
   at least one folded heat conducting member securing element disposed between said at least first and second heat conducting portions and proximate said fold portion of said at least one folded heat conducting member, for securing said base portion engaging region of said at least one folded heat conducting member into engagement with said at least one groove of said base portion.

2. The heatsink of claim 1, wherein said at Least one folded heat conducting member securing element and ,3aid base portion engaging region of said at least one folded heat conducting member are deformed against said at least one groove to secure said base portion engaging region in said at least one groove of said base portion.

3. The heatsink of claim 2, wherein said at least one groove includes a groove opening and at least first and second undercut walls extending from said groove opening, wherein a width of said at least one groove increases with a depth of said at least one groove;

wherein said at least one folded heat conducting member securing element forces said base portion engaging region of said at least one folded heat conducting member against said at least first and second undercut walls of said at least one groove.

4. The heatsink of claim 2, wherein said at least one groove has a substantially cylindrical shape; and wherein a predetermined depth of said at least one groove is greater than a predetermined radius of said substantially cylindrical shape.

5. The heatsink of claim 1, wherein said at least one folded heat conducting member includes a continuous folded heat conducting member having a plurality of fin portions, a plurality of fold portions between each of said plurality of fin portions, and a plurality of base portion engaging regions; and wherein said second side of said base portion includes a plurality of grooves, for receiving and securing each of said plurality of base portion engaging regions of said at least one folded heat conducting member.

6. The heatsink of claim 1, wherein said at least one folded heat conducting member includes a plurality U-shaped folded heat conducting members.

7. The heatsink of claim 2, said at least one folded heat conducting member securing element having a predetermined width corresponding to a distance between said at least first and second heat conducting portions of said folded heat conducting member and a predetermined thickness corresponding to a depth of said at least one groove; and wherein said at least one folded heat conducting member securing element conforms to a shape of said at least one groove.

8. The heatsink of claim 1, wherein said at least one folded heat conducting member securing element includes at least one annealed metal insert, wherein said at least one annealed metal insert is swaged to secure said base portion engaging region of said at least one folded heat conducting member into engagement with said at least one groove of said base portion.

9. The heatsink of claim 1, wherein said at least one folded heat conducting member is made of at least one of aluminum and copper.

10. The heatsink of claim 1, wherein said base portion is made of one of a work-hardened metal material and an extruded metal material.

11. The heatsink of claim 1, wherein said heat conducting base is made of at least one of aluminum and copper.

12. The heatsink of claim 1, wherein said at least one folded heat conducting member securing element is made of at least one of aluminum and copper.

13. A heatsink for dissipating heat from a heat emitting component, said heatsink comprising:

a plurality of U-shaped folded heat conducting members including first and second heat conducting portions extending from a fold portion, each of said plurality of said U-shaped folded heat conducting members including a base portion engaging region;

a base portion, for conducting heat from said heat emitting component to said plurality of said U-shaped folded heat conducting members, said base portion including a least first and second sides, said first side having a heat receiving region adapted to be positioned proximate said heat emitting component, and said second side having a least one folded heat conducting member engaging region, for engaging said base portion engaging region of each of said plurality of U-shaped folded heat conducting members; and at least one folded heat conducting member securing element disposed between said first and second heat conducting portions and proximate said fold portion of each of said plurality of U-portion engaging region of each of said plurality of U-shaped folded heat conducting members into engagement with said at least folded heat conducting member engaging region of said base portion.

14. The heatsink of claim 13 wherein said at least one folded heat conducting member engaging region of said base portion includes at least one groove for receiving said base portion engaging region of at least one of said plurality of U-shaped folded heat conducting members.

15. The heatsink of claim 14 wherein said at least one groove includes a groove opening and at least first and second undercut walls extending from said groove opening wherein a width of said of at least one groove increases with a depth of said at least one groove;

wherein said at least one folded heat conducting member securing element forces said base portion engaging region of each of said plurality of U-shaped folded heat conducting members against said at least first and second undercut walls of said at least one groove.

16. A heatsink, for dissipating heat from a heat emitting component, said heatsink comprising:

at least one folded heat conducting member including at least first and second heat conducting portions extending from a fold portion, said at least one folded heat conducting member further including a base portion engaging region;

a base portion, for conducting heat from said heat emitting component to said at least one folded heat conducting member, said base portion including at least first and second sides, said first side having a heat receiving region adapted to be positioned proximate said heat emitting component, and said second side having at least one folded conducting member engaging region, for engaging said base portion engaging region of said of at least one folded heat conducting member; and at least one annealed metal insert disposed between said at least first and second heat conducting portions and proximate said fold portion of said at least one folded heat conducting member, wherein said at least one annealed metal insert is swaged to secure said base portion engaging region of said at least one folded heat conducting member into engagement with said at least one folded heat conducting member engaging region of said base portion.

17. The heatsink of claim 16 wherein said at least one folded heat conducting member engaging region of said base portion includes at least one groove, for receiving said base portion engaging region of said at least one folded heat conducting member.

18. The heatsink of claim 17 wherein said at least one groove includes a groove opening and at least first and second undercut walls extending from said groove opening, wherein a width of said at least one groove increases with a depth of said at least one groove;

wherein said at least one annealed metal insert forces said base portion engaging region of said at least one folded heat conducting member against said at least first and second undercut walls of said at least one groove.

19. The heatsink of claim 16 wherein said at least one folded heat conducting member includes a plurality of U-shaped folded heat conducting members.

* * * * *